United States Patent
Choo et al.

(10) Patent No.: US 6,801,446 B2
(45) Date of Patent: Oct. 5, 2004

(54) READ ONLY MEMORY DEVICES WITH INDEPENDENTLY PRECHARGED VIRTUAL GROUND AND BIT LINES AND METHODS FOR OPERATING THE SAME

(75) Inventors: Yong-jae Choo, Seoul (KR); In-gyu Park, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/406,476

(22) Filed: Apr. 3, 2003

(65) Prior Publication Data

US 2004/0013020 A1 Jan. 22, 2004

(30) Foreign Application Priority Data

Jul. 18, 2002 (KR) ........................................ 2002-41975

(51) Int. Cl.[7] .............................. G11C 17/00; G11C 7/00
(52) U.S. Cl. ........................................ 365/94; 365/203
(58) Field of Search ........................ 365/94, 103, 104, 365/203

(56) References Cited

U.S. PATENT DOCUMENTS

| | | | | |
|---|---|---|---|---|
| 4,602,354 A | * | 7/1986 | Craycraft et al. | 365/104 |
| 5,689,470 A | * | 11/1997 | Inoue | 365/203 |
| 6,310,811 B1 | * | 10/2001 | Kohno | 365/203 |
| 6,473,327 B1 | * | 10/2002 | Ishizuka | 365/103 |
| 6,496,405 B2 | * | 12/2002 | Hibino | 365/104 |

* cited by examiner

*Primary Examiner*—Trong Phan
(74) *Attorney, Agent, or Firm*—Myers Bigel Sibley & Sajovec P.A.

(57) ABSTRACT

Read only memory (ROM) integrated circuit devices include one or more storage cells. A virtual ground line and a bit line are coupled to the storage cell. A precharge circuit independently controls timing of precharging of the virtual ground line and the bit line. The precharge circuit may be configured to deactivate precharging of the virtual ground line before deactivating precharging of the bit line. Precharging of the virtual ground line may be deactivated substantially concurrently with activation of discharging of the virtual ground line. Methods of operating such ROM integrated circuit devices are also provided.

27 Claims, 3 Drawing Sheets

US 6,801,446 B2

READ ONLY MEMORY DEVICES WITH INDEPENDENTLY PRECHARGED VIRTUAL GROUND AND BIT LINES AND METHODS FOR OPERATING THE SAME

RELATED APPLICATION

This application claims priority to Korean Patent Application 2002-0041975, filed on Jul. 18, 2002, the contents of which are herein incorporated by reference in their entirety.

BACKGROUND OF THE INVENTION

The present invention relates to integrated circuit memory devices, and in particular to read only memory (ROM) devices having virtual ground and bit lines.

A ROM integrated circuit device includes a ROM storage cell block including storage cells. Bits lines from the storage cells are used to output data from the storage cells during a read operations. Such devices may also include virtual ground lines that may be positioned adjacent the bit lines on the integrated circuit device. As integration density of the devices increases, the widths and lengths of lines formed in the integrated circuit device generally are reduced. As a result, electrical coupling may result between adjacent ones of the virtual ground lines and bit lines.

A variety of approaches may be taken to reduce or prevent such an electrical coupling from adversely affecting performance of the device. For example, when the virtual ground lines and the bit lines are in a precharged state, the supply of the precharge voltage to the bit lines may be stopped when the virtual ground lines are being discharged to ground. As a result, the voltage of the bit lines may be affected by the virtual ground lines and drop to a predetermined level lower than the precharge voltage. To compensate for this drop, the supply of the precharge voltage to the bit lines is not stopped until a predetermined period of time after the virtual ground lines are grounded. Thus, the affect of the virtual ground lines on the bit lines may be reduced or eliminated.

However, because the virtual ground lines and the bit lines are conventionally precharged at the same time, as described above, the precharge voltage is still applied for a predetermined period of time after the virtual ground lines are grounded. Thus, a short-circuit current may flow through the virtual ground lines and, as a result, the virtual ground lines may not be at a ground voltage level. This state may continue until the supply of the precharge voltage to the virtual ground lines stops. If the virtual ground lines are not fully grounded, the operational speed of the ROM integrated circuit device may decrease and its power consumption may increase.

SUMMARY OF THE INVENTION

Embodiments of the present invention include read only memory (ROM) integrated circuit devices including one or more storage cells. A virtual ground line and a bit line are coupled to the storage cell. A precharge circuit independently controls timing of precharging of the virtual ground line and the bit line. More particularly, the precharge circuit may be configured to deactivate precharging of the virtual ground line before deactivating precharging of the bit line.

In further embodiments of the present invention, the precharge circuit includes a virtual ground line precharge circuit that activates precharging of the virtual ground line responsive to a virtual ground line precharge signal and a bit line precharge circuit that activates precharging of the bit line responsive to a bit line precharge signal. The bit line precharge signal is deactivated after deactivation of the virtual ground line precharge signal.

In other embodiments of the present invention, a virtual ground line discharge circuit is coupled to the virtual ground line. The virtual ground line precharge circuit deactivates precharging of the virtual ground line substantially concurrently with activation of the virtual ground line discharge circuit. The virtual ground line discharge circuit may couple the virtual ground line to ground and the virtual ground line precharge circuit may couple the virtual ground line to a precharge voltage. The bit line precharge signal may couple the bit line to the precharge voltage. The virtual ground line discharge circuit may activate discharging of the virtual ground line responsive to a discharge control signal.

In further embodiments of the present invention, the virtual ground line precharge circuit is configured to activate precharging of the virtual ground line responsive to an address control signal and the virtual ground line discharge circuit is configured to activate discharging of the virtual ground line responsive to an address signal associated with the storage cell. The virtual ground line precharge circuit may include a virtual ground line precharge controller and a virtual ground line precharging unit. The virtual ground line precharge controller is configured to generate a virtual ground line precharge enable signal responsive to the address control signal and the virtual ground line precharge signal. The virtual ground line precharging unit includes a transistor having the virtual ground line precharge enable signal coupled to a gate thereof.

In other embodiments of the present invention, the virtual ground line precharge controller is configured to generate the virtual ground line precharge enable signal as a Boolean NAND operation having the address control signal and the virtual ground line precharge signal as inputs. The bit line precharge circuit may include a bit line precharge controller and a bit line precharging unit. The bit line precharge controller is configured to generate a bit line precharge enable signal responsive to the bit line precharge signal. The bit line precharging unit includes a transistor having the bit line precharge enable signal coupled to a gate thereof.

In further embodiments of the present invention, the virtual ground line discharge circuit includes a discharge controller that generates a discharge signal responsive to the discharge control signal and the address signal associated with the storage cell and a transistor having the discharge signal coupled to a gate thereof. The discharge controller may be configured to generate the discharge signal as a Boolean NAND operation having the discharge control signal and the address signal associated with the storage cell as inputs. The integrated circuit device may include a plurality of storage cells, each of the plurality of storage cells having an associated bit line and virtual ground line, precharging of the associated bit line and virtual ground line of each storage cell being independently controlled by the precharge circuit.

In other embodiments of the present invention, methods are provided of controlling precharging of a read only memory (ROM) integrated circuit device including a storage cell and a virtual ground line and a bit line coupled to the storage cell. The methods include independently controlling timing of precharging of the virtual ground line and the bit line. Independently controlling timing of precharging may include deactivating precharging of the virtual ground line before deactivating precharging of the bit line. The methods may also include discharging the virtual ground line substantially concurrently with deactivating precharging of the virtual ground line.

According to further embodiments of the present invention, a ROM integrated circuit device is provided including a ROM cell block, a virtual ground line, a virtual ground line precharging unit, a switch, a bit line, and a bit line precharging unit. The ROM cell block stores data. The virtual ground line is connected to the ROM cell block. The virtual ground line precharging unit precharges the virtual ground line in response to a virtual ground line precharge signal. The switch is connected to the virtual ground line and grounds the virtual ground line in response to a discharge signal. The bit line is connected to the ROM cell block. The bit line precharging unit precharges the bit line in response to a bit line precharge signal.

In some embodiments of the present invention, the ROM integrated circuit device further includes a virtual ground line precharge controller that receives a virtual ground line precharge control signal and an address control signal and outputs the virtual ground line precharge signal. Here, if the virtual ground line precharge control signal and the address control signal are at a logic "high" level, the virtual ground line precharge signal is at a logic "low" level and if at least one of the virtual ground line precharge control signal and the address control signal is at a logic "low" level, the virtual ground line precharge signal is at a logic "high" level.

In other embodiments of the present invention, if the virtual ground precharge signal is at a logic "low" level, the virtual ground line precharging unit is activated to precharge the virtual ground line and if the virtual ground line precharge signal is at a logic "high" level, the virtual ground line precharging unit is deactivated (inactivated). The ROM integrated circuit device may further include a bit line precharge controller that receives a bit line precharge control signal and outputs the bit line precharge signal. In such embodiments, if the bit line precharge control signal is at a logic "high" level, the bit line precharge signal is at a logic "low" level and if the bit line precharge control signal is at a logic "low" level the bit line precharge signal is at alogic "high" level.

In further embodiments of the present invention, if the bit line precharge signal is at a logic "low" level the bit line precharging unit is activated to precharge the bit line and if the bit line precharge signal is at a logic "high" level the bit line precharging unit is deactivated (inactivated). The ROM integrated circuit device may further include a discharge controller that receives a discharge control signal and an address signal and outputs the discharge signal. In such embodiments, if at least one of the discharge control signal and the address signal is at a logic "low" level, the discharge signal is at a logic "high" level and if the discharge control signal and the address signal are at a logic "high" level, the discharge signal is at a logic "low" level. If the discharge signal is at a logic "high" level, the switch may be activated to ground the virtual ground line and, if the discharge signal is at a logic "low" level, the switch may be deactivated.

In further embodiments of the present invention, a ROM integrated circuit device includes a ROM cell block, a plurality of virtual ground lines, a plurality of virtual ground line precharging units, a plurality of switches, a plurality of bit lines, and a plurality of bit line precharging units. The ROM cell block stores data. The plurality of virtual ground lines are connected to the ROM cell block. The plurality of virtual ground line precharging units precharge the plurality of virtual ground lines in response to a virtual ground line precharge signal. The plurality of switches are connected to one of the plurality of virtual ground lines and ground the virtual ground lines in response to a discharge signal. The plurality of bit lines are connected to the ROM cell block. The plurality of bit line precharging units precharge the plurality of bit lines in response to a bit line precharge signal.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" or "connected to" or "coupled to" another element, it can be directly on or connected or coupled to the other element or intervening elements may also be present. In contrast, when an element is referred to as being "directly on" or "directly connected" or "directly coupled" to another element, there are no intervening elements present.

Each embodiment described and illustrated herein includes its complementary conductivity type and/or complementary logic embodiment as well. References to source and drain of transistors herein are interchangeable and intended to encompass complementary conductivity type transistors or alternate technology type transistors except where a specific transistor type is referenced.

Figure 1:
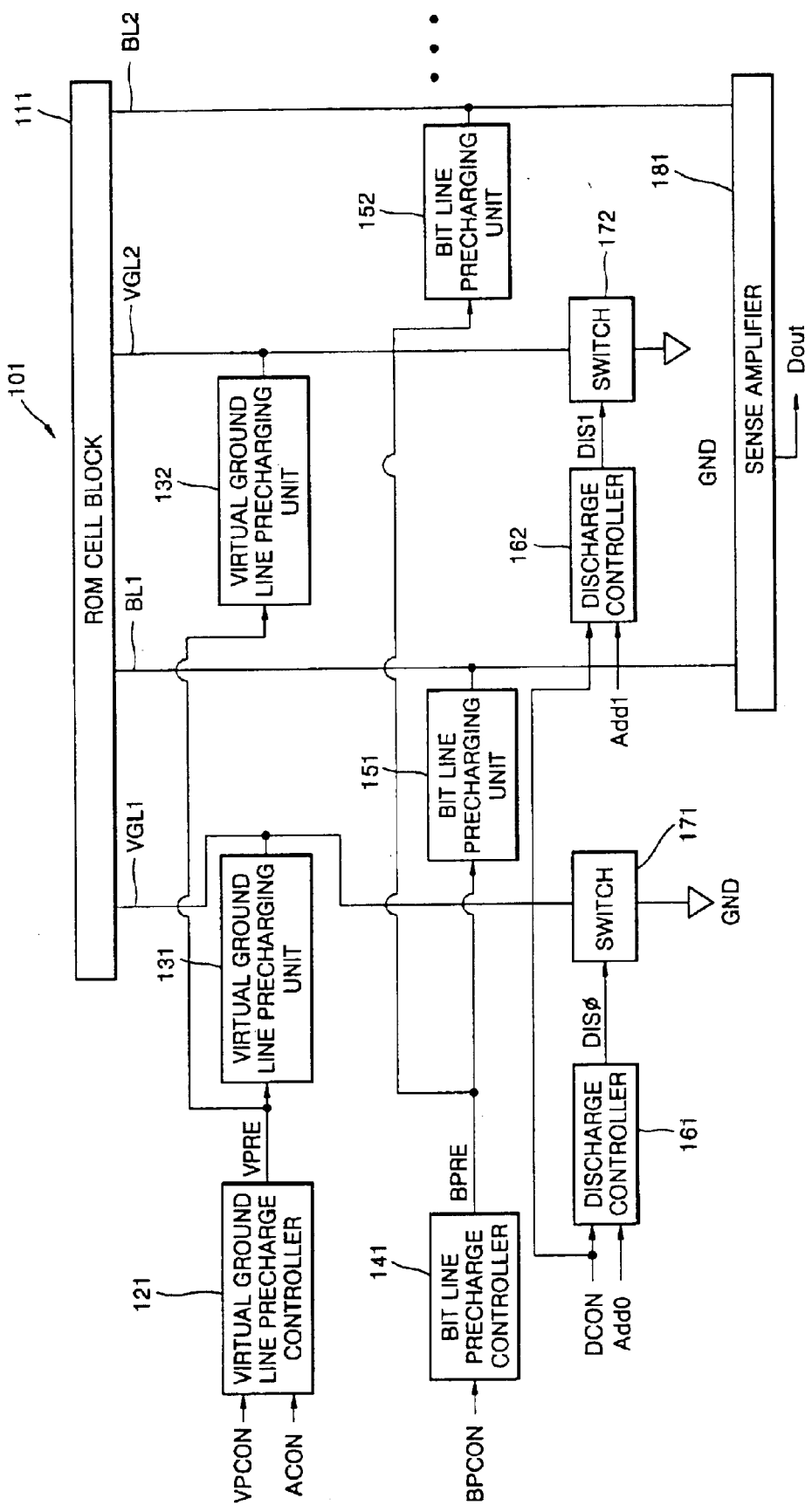
FIG. 1 is a block diagram illustrating a ROM integrated circuit device according to some embodiments of the present invention.

The present invention will now be further described with reference to FIGS. 1–5. FIG. 1 is a block diagram illustrating a read only memory (ROM) integrated circuit device according to some embodiments of the present invention. As shown in FIG. 1, a ROM integrated circuit device 101 includes a ROM cell block 111, virtual ground lines VGL1, VGL2, etc., bit lines BL1, BL2, etc., a sense amplifier 181, and a precharge circuit including a virtual ground line precharge controller 121, a virtual ground line precharging units 131, 132, etc., bit line precharge controller 141 and bit line precharging units 151, 151, etc. The precharge circuit independently controls timing of precharging of the virtual ground lines VGL1, VGL2, etc. and the bit lines BL1, BL2, etc.

The ROM cell block 111 further includes discharge controllers 161, 162, etc. and switches 171, 172, etc. The ROM cell block 111 stores data in one or more storage cells. In the ROM cell block 111, writing of data is not supported due to its read only configuration. The virtual ground lines VGL1, VGL2, etc. and the bit lines BL1, BL2, etc. are coupled to the storage cell(s) of the ROM cell block 111.

Data stored in the ROM cell block 111 is transmitted to the sense amplifier 181 via the bit lines BL1, BL2, etc. As will be understood by those of skill in the art, respective bit lines BL1, BL2, etc. are associated with individual storage cell(s), such as a column of storage cells, of the ROM cell block 111. The sense amplifier 181 amplifies the transmitted data and transmits the amplified data Dout to an external device.

To simplify understanding of the present invention, operation of the circuit device 101 will be described with reference to a particular logic type and conductivity type of various components thereof. However, it is to be understood that such details are for purposes of understanding the present invention and those of skill in the art will understand that equivalent circuits may be used of the opposite logic and using different conductivity type components and that such equivalent circuits are within the scope of the present invention.

As illustrated in FIG. 1, the virtual ground line precharge controller 121 receives a virtual ground line precharge control signal VPCON and an address control signal ACON and outputs a virtual ground line precharge signal VPRE. When the virtual ground line precharge control signal VPCON and the address control signal ACON are at a logic "high" activated level, the virtual ground line precharge controller 121 outputs the virtual ground line precharge signal VPRE at a logic "low" activated level. If either of the virtual ground line precharge control signal VPCON or the address control signal ACON is at a logic "low" level, the virtual ground line precharge controller 121 outputs the virtual ground line precharge signal VPRE at a logic "high" deactivated level.

The virtual ground line precharging units 131, 132, etc. precharge the virtual ground lines VGL1, VGL2, etc. responsive to activation of the virtual ground line precharge signal VPRE output from the virtual ground line precharge controller 121. In other words, when the virtual ground line precharge signal VPRE is at a logic "low" level, the virtual ground line precharging units 131, 132, etc. are activated to precharge the virtual ground lines VGL1, VGL2, etc. When the virtual ground line precharge signal VPRE is at a logic "high" level, the virtual ground line precharging units 131, 132, etc. are deactivated and, thus, do not couple the virtual ground lines VGL1, VGL2, etc. to a precharge voltage.

The bit line precharge controller 141 receives a bit line precharge control signal BPCON and outputs a bit line precharge signal BPRE. When the bit line precharge control signal BPCON is at a logic "high" level, the bit line precharge controller 141 outputs the bit line precharge signal BPRE at a logic "low" activated level. When the bit line precharge control signal BPCON is at a logic "low" level, the bit line precharge controller 141 outputs the bit line precharge signal BPRE at a logic "high" deactivated level.

The bit line precharging units 151, 152, etc. precharge the bit lines BL1, BL2, etc. responsive to the bit line precharge signal BPRE output from the bit line precharge controller 141. In other words, when the bit line precharge signal BPRE is at a logic "low" level, the bit line precharging units 151, 152, etc. are activated to couple the bit lines BL1, BL2, etc. to a precharge voltage. When the bit line precharge signal BPRE is at a logic "high" level, the bit line precharging units 151, 152, etc. are deactivated and, thus, do not couple the bit lines BL1, BL2, etc. to the precharge voltage.

The discharge controllers 161, 162, etc. receive a discharge control signal DCON and address signals ADD0, ADD1, etc. and output discharge signals DIS0, DIS1, etc. In particular, for example, the discharge controller 161 receives the discharge signal DCON and the address signal ADD0 and outputs the discharge signal DIS0. If either the discharge control signal DCON or the address signal ADD0 is at a logic "low" level, the discharge controller 161 outputs the discharge signal DIS0 at a logic "high" activated level. If the discharge control signal DCON and the address signal ADD0 are both at a logic "high" level, the discharge controller 161 outputs the discharge signal DIS0 at a logic "low" deactivated level.

Similarly, the discharge controller 162 receives the discharge control signal DCON and the address signal ADD1 and outputs the discharge signal DIS1. If either the discharge control signal DCON or the address signal ADD1 is at a logic "low" level, the discharge controller 162 outputs the discharge signal DIS1 at a logic "high" activated level. When the discharge control signal DCON and the address signal ADD1 are both at a logic "high" level, the discharge controller 162 outputs the discharge signal DIS1 at a logic "low" deactivated level. Thus, as described above, the discharge controllers 161, 162, etc. are selectively activated responsive to the address signals ADD0, ADD1, etc.

The switches 171, 172, etc. selectively couple the virtual ground lines VGL1, VGL2, etc. to ground responsive to the discharge signals DIS0, DIS1, etc. In other words, when the discharge signal DIS0 is at a logic "high" level, the switch 171 is activated to ground the virtual ground line VGL1. When the discharge signal DIS0 is at a logic "low" level, the switch 171 is deactivated, and, thus, the virtual ground line VGL1 is not grounded. Similarly, when the discharge signal DIS1 is at a logic "high" level, the switch 172 is activated to ground the virtual ground line VGL2. When the discharge signal DIS1 is at a logic low" level, the switch 172 is deactivated, and, thus, the virtual ground line VGL2 is not grounded.

Figure 2:
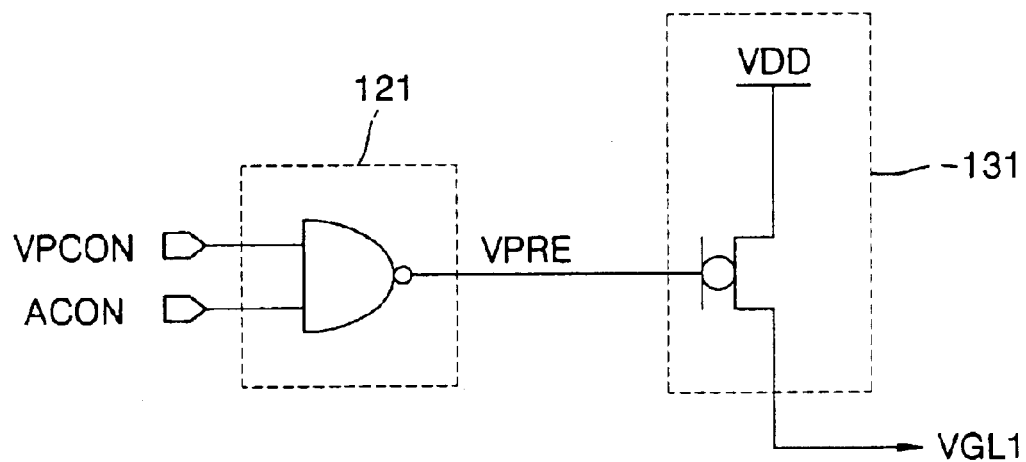
FIG. 2 is a circuit diagram illustrating the virtual ground line precharge controller and the first virtual ground line precharging unit illustrated in FIG. 1 according to some embodiments of the present invention.

FIG. 2 is a circuit diagram illustrating the virtual ground line precharge controller 121 and the virtual ground line precharging unit 131 of FIG. 1 according to some embodiments of the present invention. As shown in FIG. 2, the virtual ground line precharge controller 121 includes a NAND gate that receives the virtual ground line precharge control signal VPCON and the address control signal ACON as inputs and outputs the virtual ground line precharge signal VPRE (i.e., generates VPRE as a Boolean NAND operation of VPCON and ACON). The virtual ground line precharging unit 131, as illustrated in the embodiments of FIG. 2, includes a PMOS transistor that has a source coupled to a power voltage VDD, a gate coupled to the virtual ground line precharge signal VPRE and a drain coupled to the virtual ground line VGL1.

Figure 3:
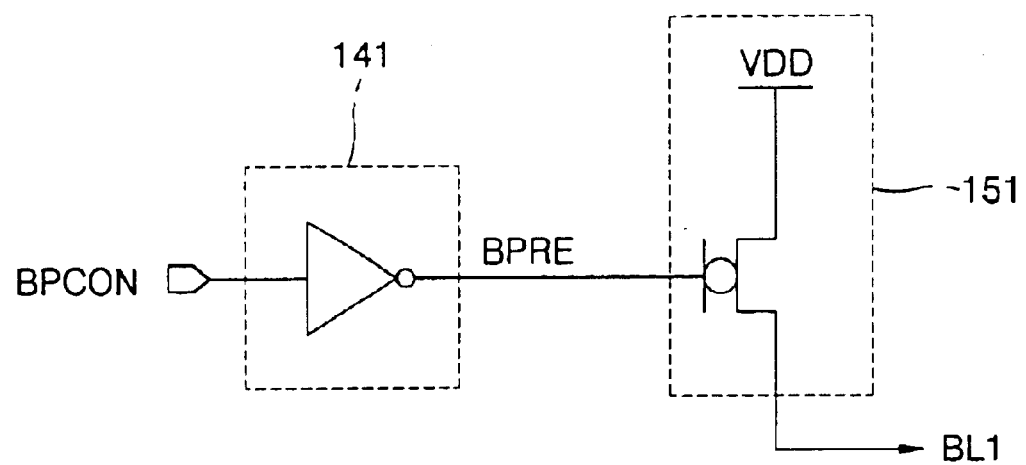
FIG. 3 is a circuit diagram illustrating the bit line precharge controller and the first bit line precharging unit illustrated in FIG. 1 according to some embodiments of the present invention.

FIG. 3 is a circuit diagram illustrating the bit line precharge controller 141 and the bit line precharging unit 151 of FIG. 1 according to some embodiments of the present invention. As shown in FIG. 3, the bit line precharge controller 141 includes an inverter that receives the bit line precharge control signal BPCON as an input and outputs the bit line precharge signal BPRE. The bit line precharging unit 151, as illustrated in the embodiments of FIG. 3, includes a PMOS transistor that has a source coupled to the power voltage VDD, a gate coupled to the bit line precharge signal BPRE and a drain coupled to the bit line BL1.

Figure 4:
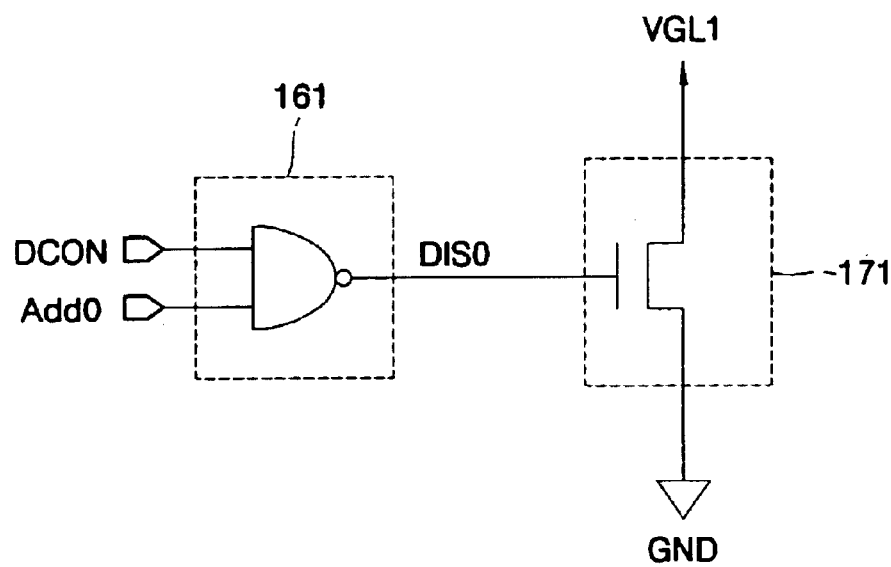
FIG. 4 is a circuit diagram illustrating some embodiments of the first discharge controller and the first switch illustrated in FIG. 1 according to the present invention.

FIG. 4 is a circuit diagram illustrating the discharge controller 161 and the switch 171 of FIG. 1 according to some embodiments of the present invention. As shown in FIG. 4, the discharge controller 161 includes a NAND gate that receives the discharge control signal DCON and the address signal ADD0 as inputs and outputs the discharge signal DIS0. The switch 171 includes a NMOS transistor that has a drain coupled to the virtual ground line VGL1, a gate coupled to the discharge signal DIS0 and a source coupled to ground.

Figure 5:
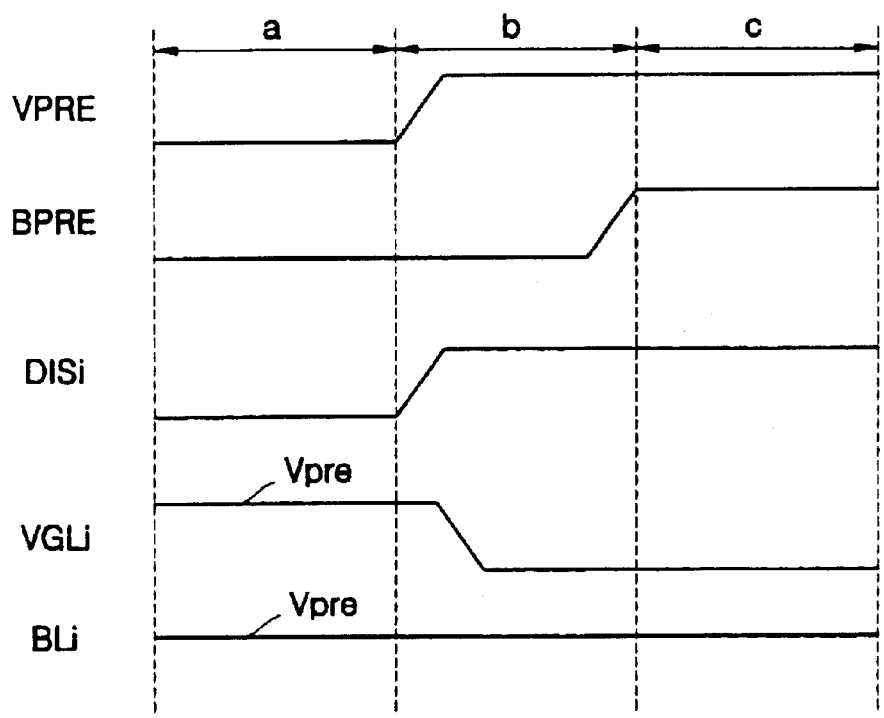
FIG. 5 is a timing diagram illustrating operations of the device illustrated in FIG. 1 according to some embodiments of the present invention.

FIG. 5 is a timing diagram illustrating operations of the device 101 of FIG. 1. As shown in section (a) of FIG. 5, the virtual ground line precharge signal VPRE, the bit line precharge signal BPRE, and the discharge signal DISi are at a logic "low" level. The virtual ground lines VGLi and the bit lines BLi are precharged to a precharge voltage Vpre. As shown in section (b), the virtual ground line precharge signal VPRE and the discharge signal DISi are transitioned, substantially concurrently, to a logic "high" level and the virtual ground lines VGL1 (VGLi, VGL2, etc. illustrated in FIG. 1) are grounded. The virtual ground lines VGLi are selectively grounded depending on whether their respective address signals (ADD0, ADD1, etc. illustrated in FIG. 1) are activated. However, as VPRE is deactivated (shown as a logic "high" level) the supply of the precharge voltage Vpre to the virtual ground lines VGLi stops at substantially the same time as when the virtual ground lines VGLi are selectively grounded. Thus, a short-circuit condition, in which current would flow from Vpre to the virtual ground lines VGLi, may be reduced or prevented.

Even though the virtual ground lines VGLi are grounded and decoupled from the precharge voltage Vpre, the supply of the precharge voltage Vpre to the bit lines BLi (BL1, BL2, etc. illustrated in FIG. 1) is maintained. Thus, although the virtual ground lines VGLi may be adjacent to the bit lines BLi, the voltage of the bit lines Bli may not drop when the virtual ground lines VGLi are grounded. In other words any electronic coupling effect between the virtual ground and bit lines may be reduced.

As shown at section (c) of FIG. 5, the bit line precharge signal BPRE is transitioned to a logic "high" deactivated level so the virtual ground line precharge signal VPRE, the bit line precharge signal BPRE and the discharge signal DISi are all at a logic "high" level. Thus, the virtual ground lines VGLi are still selectively grounded and the supply of the precharge voltage to the bit lines BLi stops. Therefore, in section (c), data stored in the ROM cell block 11 (illustrated in FIG. 1) may be read.

As described above, the timing of precharging of the virtual ground lines (VGL1, VGL2, etc. illustrated in FIG. 1) and the bit lines (BL1, BL2, etc. illustrated in FIG. 1) are independently controlled. Thus, when the virtual ground lines (VGL1, VGL2, etc. illustrated in FIG. 1) are grounded, a short-circuit current may be reduced or prevented from flowing through the virtual ground lines. As a result, the operational speed of the ROM integrated circuit device 101 (illustrated in FIG. 1) may be increased and power consumption may be decreased. Furthermore, when the virtual ground lines (VGL1, VGL2, etc. illustrated in FIG. 1) are grounded, the supply of the precharge voltage Vpre to the bit lines (BL1, BL2, etc. illustrated in FIG. 1) may be continued. Thus, the precharge voltage Vpre of the bit lines may be reduced or prevented from dropping.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A read only memory (ROM) integrated circuit device comprising:
   a storage cell;
   a virtual ground line coupled to the storage cell;
   a bit line coupled to the storage cell; and
   a precharge circuit that independently controls timing of precharging of the virtual ground line and the bit line, wherein the precharge circuit is configured to deactivate precharging of the virtual ground line before deactivating precharging of the bit line.

2. The device of claim 1 wherein the precharge circuit comprises:
   a virtual ground line precharge circuit that activates precharging of the virtual ground line responsive to a virtual ground line precharge signal; and
   a bit line precharge circuit that activates precharging of the bit line responsive to a bit line precharge signal, the bit line precharge signal being deactivated after deactivation of the virtual ground line precharge signal.

3. The device of claim 2 further comprising a virtual ground line discharge circuit coupled to the virtual ground line and wherein the virtual ground line precharge circuit deactivates precharging of the virtual ground line substantially concurrently with activation of the virtual ground line discharge circuit.

4. The device of claim 3 wherein the virtual ground line discharge circuit couples the virtual ground line to ground and wherein the virtual ground line precharge circuit couples the virtual ground line to a precharge voltage and wherein the bit line precharge signal couples the bit line to the precharge voltage.

5. The device of claim 3 wherein the virtual ground line discharge circuit activates discharging of the virtual ground line responsive to a discharge control signal.

6. The device of claim 5 wherein the virtual ground line precharge circuit is configured to activate precharging of the virtual ground line responsive to an address control signal and wherein the virtual ground line discharge circuit is configured to activate discharging of the virtual ground line responsive to an address signal associated with the storage cell.

7. A read only memory (ROM) integrated circuit device comprising:
   a storage cell;
   a virtual ground line coupled to the storgae cell;
   a bit line coupled to the storage cell; and
   a precharge circuit that independently controls timing of precharging of the virtual ground line and the bit line, the precharge circuit including a virtual ground line precharge circuit that activates precharging of the virtual ground line responsive to a virtual ground line precharge signal;
   wherein the virtual ground line precharge circuit comprises a virtual ground line precharge controller and a virtual ground line precharging unit; and
   wherein the virtual ground line precharge controller is configured to generate a virtual ground line precharge enable signal responsive to an address control signal and a virtual ground line precharge signal and wherein the virtual ground line precharging unit comprises a transistor having the virtual ground line precharge enable signal coupled to a gate thereof.

8. The device of claim 7 wherein the virtual ground line precharge controller is configured to generate the virtual ground line precharge enable signal as a Boolean NAND operation having the address control signal and the virtual ground line precharge signal as inputs.

9. The device of claim 7 wherein the bit line precharge circuit comprises a bit line precharge controller and a bit line precharging unit, wherein the bit line precharge controller is configured to generate a bit line precharge enable signal responsive to the bit line precharge signal and wherein the bit line precharging unit comprises a transistor having the bit line precharge enable signal coupled to a gate thereof.

10. The device of claim 7 wherein the virtual ground line discharge circuit comprises a discharge controller that generates a discharge signal responsive to the discharge control signal and the address signal associated with the storage cell and a transistor having the discharge signal coupled to a gate thereof.

11. The device of claim 10 wherein the discharge controller is configured to generate the discharge signal as a Boolean NAND operation having the discharge control signal and the address signal associated with the storage cell as inputs.

12. The device of claim 11 comprising a plurality of storage cells, each of the plurality of storage cells having an associated bit line and virtual ground line, precharging of the associated bit line and virtual ground line of each storage cell being independently controlled by the precharge circuit.

13. The device of claim 1 comprising a plurality of storage cells, each of the plurality of storage cells having an associated bit line and virtual ground line, precharging of the associated bit line and virtual ground line of each storage cell being independently controlled by the precharge circuit.

14. A method of controlling precharging of a read only memory (ROM) integrated circuit device including a storage cell and a virtual ground line and a bit line coupled to the storage cell, the method comprising:
independently controlling timing of precharging of the virtual ground line and the bit line, including deactivating precharging of the virtual ground line before deactivating precharging of the bit line.

15. The method of claim 14 further comprising discharging the virtual ground line substantially concurrently with deactivating precharging of the virtual ground line.

16. A ROM intearated circuit device comprising:
a ROM cell block that stores data;
a virtual ground line that is connected to the ROM cell block;
a virtual ground line precharging unit that precharges the virtual ground line in response to a virtual ground line precharge signal;
a switch that is connected to the virtual ground line and grounds the virtual ground line in response to a discharge signal;
a bit line that is connected to the ROM cell block;
a bit line precharging unit that precharges the bit line in response to a bit line precharge signal; and
a virtual ground line precharge controller that receives a virtual ground line precharge control signal and an address control signal and outputs the virtual ground line precharge signal, wherein if the virtual ground line precharge control signal and the address control signal are logic "high", the virtual ground line precharge signal is logic "low", and if at least one of the virtual ground line precharge control signal and the address control signal is logic "low", the virtual ground line precharge signal is logic "high".

17. The device of claim 16, wherein if the virtual ground precharge signal is logic "low", the virtual ground line precharging unit is activated to precharge the virtual ground line, and if the virtual ground line precharge signal is logic "high", the virtual ground line precharging unit is inactivated.

18. A ROM integrated circuit device comprising:
a ROM cell block that stores data;
a virtual ground line that is connected to the ROM cell block;
a virtual ground line precharging unit that precharges the virtual ground line in response to a virtual ground line precharge signal;
a switch that is connected to the virtual ground line and grounds the virtual ground line in response to a discharge signal;
a bit line that is connected to the ROM cell block;
a bit line precharging unit that precharges the bit line in response to a bit line precharge signal; and
a bit line precharge controller that receives a bit line precharge control signal and outputs the bit line precharge signal, wherein if the bit line precharge control signal is logic "high", the bit line precharge signal is logic "low", and if the bit line precharge control signal is logic "low", the bit line precharge signal is logic "high".

19. The device of claim 18, wherein if the bit line precharge signal is logic "low", the bit line precharging unit is activated to precharge the bit line, and if the bit line precharge signal is logic "high", the bit line precharging unit is inactivated.

20. A ROM integrated circuit device comprising:
a ROM cell block that stores data;
a virtual ground line that is connected to the ROM cell block;
a virtual ground line precharging unit that precharges the virtual ground line in response to a virtual ground line precharge signal;
a switch that is connected to the virtual ground line and grounds the virtual ground line in response to a discharge signal;
a bit line that is connected to the ROM cell block;
a bit line precharging unit that precharges the bit line in response to a bit line precharge signal; and
a discharge controller that receives a discharge control signal and an address signal and outputs the discharge signal, wherein if at least one of the discharge control signal and the address signal is logic "low", the discharge signal is logic "high", and the discharge control signal and the address signal are logic "high", the discharge signal is logic "low".

21. The device of claim 20, wherein if the discharge signal is logic "high", the switch is activated to ground the virtual ground line, and if the discharge signal is logic "low", the switch is inactivated.

22. A ROM integrated circuit device comprising:
a ROM cell block that stores data;
a virtual ground line that is connected to the ROM cell block;
a virtual ground line precharging unit that precharges the virtual ground line in response to a virtual ground line precharge signal;
a switch that is connected to the virtual ground line and grounds the virtual ground line in response to a discharge signal;

a bit line that is connected to the ROM cell block;

a bit line precharging unit that precharges the bit line in response to a bit line precharge signal;

a plurality of virtual ground lines that are connected to the ROM cell block;

a plurality of virtual ground line precharging units that precharge the plurality of virtual ground lines in response to a virtual ground line precharge signal;

a plurality of switches that are connected to one of the plurality of virtual ground lines and ground the virtual ground lines in response to a discharge signal;

a plurality of bit lines that are connected to the ROM cell block;

a plurality of bit line precharging units that precharge the plurality of bit lines in response to a bit line precharge signal; and a virtual ground line precharge controller that receives a virtual ground line precharge control signal and an address control signal and outputs the virtual ground line precharge signal, wherein if the virtual ground line precharge control signal and the address control signal are logic "high", the virtual ground line precharge signal is logic "low", and if at least one of the virtual ground line precharge control signal and the address control signal is logic "low", the virtual ground line precharge signal is logic "high".

23. The device of claim 22, wherein if the virtual ground line precharge signal is logic "low", the plurality of ground line precharging units are activated to precharge the virtual ground lines, and if the virtual ground line precharge signal is logic "high", the virtual ground line precharging units are inactivated.

24. The device of claim 20, further comprising a bit line precharge controller that receives a bit line precharge control signal and outputs the bit line precharge signal, wherein if the bit line precharage control signal is logic "high", the bit line precharge signal is logic "low", and if the bit line precharge control signal is logic "low", the bit line precharge signal is logic "high".

25. The device of claim 24, wherein if the bit line precharge signal is logic "low", the plurality of bit line precharging units are activated to precharage the bit lines, and if the bit line precharge signal is logic "high", the plurality of bit line precharging units are inactivated.

26. The device of claim 20, further comprising a plurality of discharge controllers that receive a discharge control signal and an address signal and output the discharge signal, wherein if at least one of the discharge control signal and the address signal is logic "low", the plurality of discharge controllers output the discharge control signal in logic "high", and if the discharge control signal and the address signal are logic "high", the plurality of discharge controllers output the discharge signal in logic "low".

27. The device of claim 26, wherein if the discharge signal is logic "high", the switches are activated to ground a corresponding virtual ground lines, and if the discharge signal is logic "low", the switches are inactivated.

* * * * *